(12) United States Patent
Jang et al.

(10) Patent No.: US 10,720,447 B2
(45) Date of Patent: Jul. 21, 2020

(54) INTEGRATED CIRCUIT MEMORY DEVICES HAVING IMPURITY-DOPED DIELECTRIC REGIONS THEREIN AND METHODS OF FORMING SAME

(71) Applicant: Samsung Electronics Co., Ltd., Suwon-si, Gyeonggi-do (KR)

(72) Inventors: Woo Jin Jang, Suwon-si (KR); Young Jin Noh, Suwon-si (KR); Jun Kyu Yang, Seoul (KR); Bio Kim, Seoul (KR); Kyong Won An, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/512,951

(22) Filed: Jul. 16, 2019

(65) Prior Publication Data

US 2019/0341400 A1 Nov. 7, 2019

Related U.S. Application Data

(63) Continuation of application No. 16/001,975, filed on Jun. 7, 2018, now Pat. No. 10,411,034.

(30) Foreign Application Priority Data

Nov. 21, 2017 (KR) ........................ 10-2017-0155585

(51) Int. Cl.
| | | |
|---|---|---|
| *H01L 27/11582* | (2017.01) | |
| *H01L 27/1157* | (2017.01) | |
| *H01L 29/06* | (2006.01) | |
| *H01L 29/10* | (2006.01) | |
| *H01L 29/51* | (2006.01) | |
| *H01L 23/528* | (2006.01) | |
| *H01L 21/311* | (2006.01) | |
| *H01L 21/3115* | (2006.01) | |
| *H01L 21/02* | (2006.01) | |

(Continued)

(52) U.S. Cl.
CPC .... *H01L 27/11582* (2013.01); *H01L 21/0223* (2013.01); *H01L 21/3115* (2013.01); *H01L 21/31111* (2013.01); *H01L 23/528* (2013.01); *H01L 23/5226* (2013.01); *H01L 27/1157* (2013.01); *H01L 29/0649* (2013.01); *H01L 29/1037* (2013.01); *H01L 29/40117* (2019.08); *H01L 29/513* (2013.01); *H01L 27/11565* (2013.01); *H01L 29/518* (2013.01)

(58) Field of Classification Search
CPC ........... H01L 27/11582; H01L 27/1157; H01L 21/3115
USPC ....................................................... 257/324
See application file for complete search history.

(56) References Cited

U.S. PATENT DOCUMENTS

| | | | |
|---|---|---|---|
| 8,618,603 | B2 | 12/2013 | Ozawa et al. |
| 9,230,980 | B2 | 1/2016 | Rabkin et al. |

(Continued)

*Primary Examiner* — David Vu
*Assistant Examiner* — Brandon C Fox
(74) *Attorney, Agent, or Firm* — Myers Bigel, P.A.

(57) ABSTRACT

An integrated circuit memory device includes a vertical stack structure containing an interlayer insulating layer and a gate electrode, on a substrate. A blocking dielectric region is provided on a sidewall of an opening in the stack structure. A lateral impurity region is provided, which extends between the blocking dielectric region and the interlayer insulating layer and between the blocking dielectric region and the gate electrode. A lower impurity region is also provided, which extends between the blocking dielectric region and the substrate.

11 Claims, 20 Drawing Sheets

(51) Int. Cl.
*H01L 23/522* (2006.01)
*H01L 21/28* (2006.01)
*H01L 27/11565* (2017.01)

(56) References Cited

U.S. PATENT DOCUMENTS

| | | |
|---|---|---|
| 9,257,573 B2 | 2/2016 | Choi et al. |
| 9,276,133 B2 | 3/2016 | Kim et al. |
| 9,281,414 B2 | 3/2016 | Won et al. |
| 9,461,061 B2 | 10/2016 | Nam et al. |
| 9,601,508 B2 | 3/2017 | Sel et al. |
| 2012/0012920 A1* | 1/2012 | Shin .................. H01L 27/11578 |
| | | 257/324 |
| 2017/0062471 A1 | 3/2017 | Son et al. |
| 2017/0069647 A1 | 3/2017 | Ohashi et al. |
| 2017/0186766 A1 | 6/2017 | Kitao et al. |
| 2017/0200611 A1 | 7/2017 | Park et al. |
| 2018/0114794 A1 | 4/2018 | Jang et al. |
| 2018/0151672 A1 | 5/2018 | Choi et al. |
| 2019/0067318 A1 | 2/2019 | Shioda et al. |
| 2019/0081068 A1* | 3/2019 | Huang .............. H01L 27/11582 |
| 2019/0081144 A1 | 3/2019 | Isogai et al. |

\* cited by examiner

INTEGRATED CIRCUIT MEMORY DEVICES HAVING IMPURITY-DOPED DIELECTRIC REGIONS THEREIN AND METHODS OF FORMING SAME

REFERENCE TO PRIORITY APPLICATION

The present application is a continuation application of and claims priority from U.S. patent application Ser. No. 16/001,975, filed Jun. 7, 2018, which claims priority to Korean Patent Application No. 10-2017-0155585, filed Nov. 21, 2017, the disclosures of which are hereby incorporated herein by reference in their entirety.

BACKGROUND

1. Field

The present inventive concept relates to semiconductor devices and more particularly, to semiconductor devices having impurity regions therein.

2. Description of Related Art

The degree of integration of semiconductor devices, such as flash memories, is an important factor that may determine the price of semiconductor products. A three-dimensional semiconductor device, including memory cells arranged three-dimensionally, has been proposed, together with a large semiconductor wafer, in order to increase the degrees of integration of such semiconductor devices. As the constituent elements of the three-dimensional semiconductor devices have a more compact size in order to increase the degree of integration of three-dimensional semiconductor devices, the defect rate of three-dimensional semiconductor devices has increased.

SUMMARY

An aspect of the present inventive concept may provide a semiconductor device that supports increases in integration density, and may improve distribution properties.

According to an example embodiment of the present inventive concept, a semiconductor device is provided, which includes a blocking dielectric disposed on a lower region, and a stack structure containing an interlayer insulating layer and a gate electrode facing the blocking dielectric. A lateral impurity region is also provided, which is disposed within a boundary region between the interlayer insulating layer and the blocking dielectric. A lower impurity region is provided, which is disposed within a boundary region between the lower region and the blocking dielectric.

According to another embodiment of the present inventive concept, a semiconductor device is provided, which includes vertical memory cell structures on a substrate. Each of the memory cell structures may include a first gate dielectric and a stack structure disposed on the substrate. The stack structure includes an interlayer insulating layer and a gate electrode facing the memory cell structures. A lateral impurity region is provided, which is disposed within a boundary region between the memory cell vertical structures and the stack structure.

According to another embodiment of the present inventive concept, a semiconductor device is provided, which includes a lower region, a blocking dielectric disposed on the lower region, and a stack structure containing an interlayer insulating layer and a gate electrode facing the blocking dielectric. A lower impurity region is also provided, which is disposed within a boundary region between the lower region and the blocking dielectric.

According to another embodiment of the invention, an integrated circuit memory device is provided, which includes a stack structure on a substrate. This stack structure contains at least one interlayer insulating layer and at least one gate electrode. A blocking dielectric region is provided on a sidewall of an opening (e.g., vertical opening) in the stack structure. A lateral impurity region is provided, which extends between the blocking dielectric region and the interlayer insulating layer and between the blocking dielectric region and the gate electrode. A lower impurity region is also provided, which extends between the blocking dielectric region and the substrate. A lower region may also be provided on the substrate, and this lower region may be configured as a semiconductor material in contact with the blocking dielectric region.

According to further aspects of this embodiment of the invention, at least a portion of the lower impurity region extends within the lower region, and the lower region is electrically coupled to the substrate. A data storage layer may also be provided on the blocking dielectric region, and a tunnel dielectric layer may be provided on the data storage layer. A channel semiconductor layer may be provided, which extends on the tunnel dielectric layer and contacts the lower region. The blocking dielectric region, the data storage layer and the tunnel dielectric layer may extend between the channel semiconductor layer and the gate electrode. In addition, a gate dielectric layer may be provided, which extends between the gate electrode and the blocking dielectric region. In some of these embodiments of the invention, a dielectric constant associated with the gate dielectric layer is greater than a dielectric constant associated with the blocking dielectric region. Moreover, the gate dielectric layer may contact the blocking dielectric region, and the lateral impurity region may extend into a boundary between the gate dielectric layer and the blocking dielectric region. This lateral impurity region may include a carbon impurity.

According to further embodiments of the invention, a non-volatile memory cell is provided, which includes a semiconductor channel region and a data storage region on the semiconductor channel region. A tunnel dielectric region is provided, which extends between the semiconductor channel region and the data storage region. A gate dielectric region is provided on the data storage region. The gate dielectric region preferably includes a carbon impurity region therein. A blocking dielectric region is provided, which extends between the gate dielectric region and the data storage region. The blocking dielectric region also includes a carbon impurity region therein. A gate electrode is provided on the gate dielectric region.

According to further aspects of the memory cell, a dielectric constant associated with the gate dielectric region may be greater than a dielectric constant associated with the blocking dielectric region. In addition, a gate dielectric region may contact the blocking dielectric region at an interface therebetween. A level of carbon impurities in the gate dielectric region may vary as a function of distance from the interface, and a level of carbon impurities in the blocking dielectric region may vary as a function of distance from the interface.

BRIEF DESCRIPTION OF DRAWINGS

The above, and other aspects, features, and advantages of the present disclosure will be more clearly understood from the following detailed description when taken in conjunction with the accompanying drawings.

DETAILED DESCRIPTION

Figure 1:
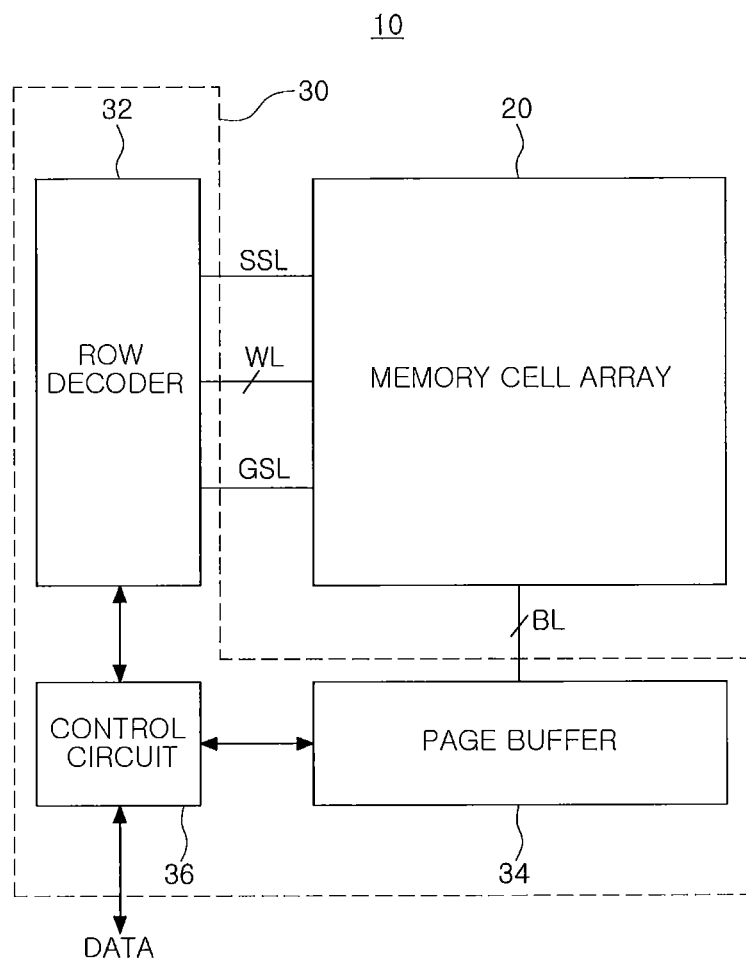
FIG. 1 is a schematic block diagram of a semiconductor device, according to an example embodiment of the invention.

An example of a semiconductor device, according to an example embodiment of the present inventive concept, will be described with reference to FIG. 1, which is a schematic block diagram of the semiconductor device. Referring to FIG. 1, a semiconductor device 10, according to an example embodiment, may include a memory cell array region 20 and a control logic region 30. The memory cell array region 20 may include a plurality of memory blocks, and each of the memory blocks may include a plurality of memory cells. The control logic region 30 may include a row decoder 32, a page buffer 34, and a control circuit 36.

The memory cells of the memory cell array region 20 may be connected to the row decoder 32 via a string select line SSL, a plurality of word lines WLs, and a ground select line GSL, and may be connected to the page buffer 34 via bit lines BLs. In example embodiments, a plurality of memory cells arranged in an identical row may be connected to an identical word line WL, and a plurality of memory cells arranged in an identical column may be connected to an identical bit line BL.

The row decoder 32 may decode an input address to generate and transmit driving signals for the word line WL. The row decoder 32 may provide a word line voltage, generated by a voltage generating circuit of the control circuit 36, to a selected word line WL and unselected word lines WLs of the word lines WLs, in response to control of the control circuit 36.

The page buffer 34 may be connected to the memory cell array region 20 via the bit lines BLs to read information stored in the memory cells. The page buffer 34 may temporarily store data to be stored in the memory cells, or may sense data stored in the memory cells, according to an operating mode. The page buffer 34 may include a column decoder and a sense amplifier. The column decoder may selectively activate the bit lines BLs of the memory cell array region 20, and the sense amplifier may sense a voltage of a bit line BL selected by the column decoder during a reading operation to read data stored in a selected memory cell. The control circuit 36 may control operations of the row decoder 32 and the page buffer 34. The control circuit 36 may receive an external control signal and an external voltage, and may operate in response to the received control signal. The control circuit 36 may include the voltage generating circuit that may generate voltages required for internal operations, for example, a program voltage, a read voltage, an erase voltage, and the like, using the external voltage. The control circuit 36 may control reading, writing, and/or erasing operations, in response to the control signals. Further, the control circuit 36 may include an input/output (I/O) circuit. The I/O circuit may receive data DATA and transfer DATA to the page buffer 34 in a program operation, and may externally output DATA received from the page buffer 34 in a reading operation.

Figure 2:
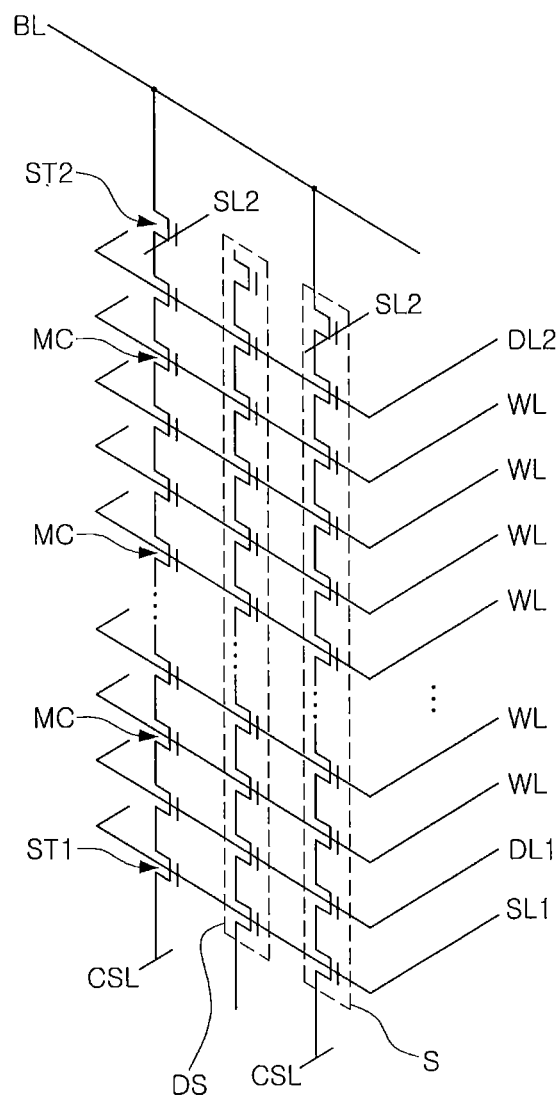
FIG. 2 is a circuit diagram conceptually illustrating an example of a memory cell array of a semiconductor device, according to an example embodiment of the invention.

Referring to FIG. 2, an example of a circuit of the memory cell array region 20 (FIG. 1) of the semiconductor device 10 (FIG. 1) described above with reference to FIG. 1, will be described. FIG. 2 is a circuit diagram conceptually illustrating the example of the memory cell array region 20 (FIG. 1). Referring to FIG. 2, the memory cell array region 20 (FIG. 1) may include memory cells MCs connected to each other in series, and a first select transistor ST1 and a second select transistor ST2 connected to opposite ends of the memory cells MCs in series. The first and second select transistors ST1 and ST2, and the memory cells MCs between the first and second select transistors ST1 and ST2 may constitute respective memory strings S. The memory cells MCs connected to each other in series may be respectively connected to word lines WLs for selecting the memory cells MCs.

A gate terminal of the first select transistor ST1 may be connected to a first select line SL1, and a source terminal of the first select transistor ST1 may be connected to a common source line CSL. A gate terminal of the second select transistor ST2 may be connected to a second select line SL2, and a source terminal of the second select transistor ST2 may be connected to a drain terminal of the memory cells MCs. In an example, the first select transistor ST1 may be a ground select transistor, and the second select transistor ST2 may be a string select transistor. In an example, the first select line SL1 may be a ground select line, and the second select line SL2 may be a string select line.

FIG. 2 illustrates a structure in which a single first select transistor ST1 and a single second select transistor ST2 may be connected to the memory cells MCs connected to each other in series. In a different embodiment, a plurality of first select transistors ST1 or a plurality of second select transistors ST2 may also be connected to the memory cells MCs.

In an example, a first dummy line DL1 may be disposed between a lowermost word line WL of the word lines WLs and the first select line SL1, and a second dummy line DL2 may be disposed between an uppermost word line WL of the word lines WLs and the second select line SL2. The first dummy line DL1 may be provided as a single or a plurality of first dummy lines DL1, and the second dummy line DL2 may be provided as a single or a plurality of second dummy lines DL2.

A drain terminal of the second select transistor ST2 may be connected to a bit line BL. When a signal is applied to the gate terminal of the second select transistor ST2 through the second select line SL2, a signal applied through the bit line BL may be transmitted to the memory cells MCs connected to each other in series, and a data reading or writing operation may thereby be performed. Furthermore, an operation to erase data stored in the memory cells MCs may be performed by applying a data erasing voltage having a certain level to the memory cells MCs through a substrate.

The semiconductor device 10, according to an example embodiment, may include at least one dummy string DS. The at least one dummy string DS may include a string having a dummy channel electrically isolated from the bit line BL.

Figure 3:
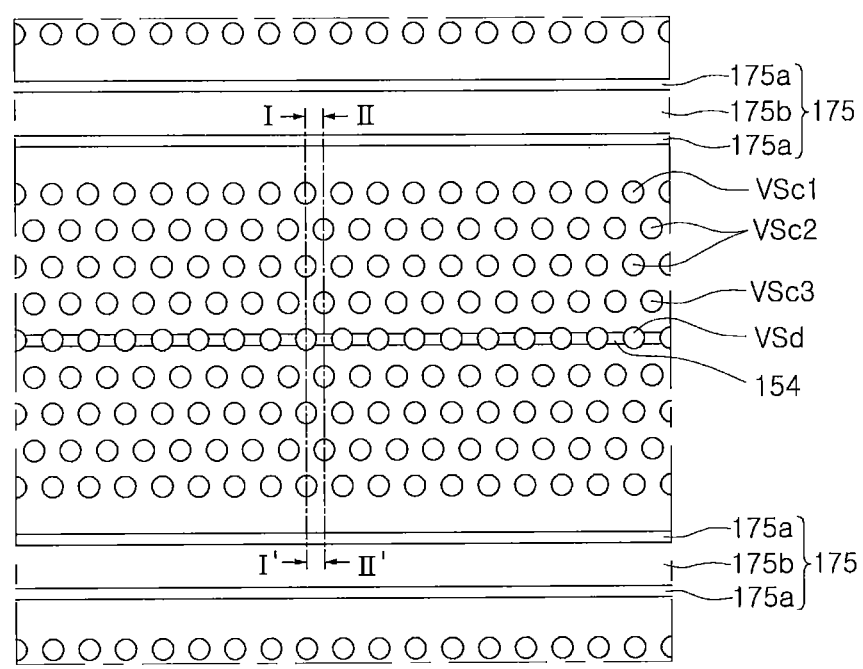
FIG. 3 is a plan view of a semiconductor device, according to an example embodiment of the invention.
Figure 4A:
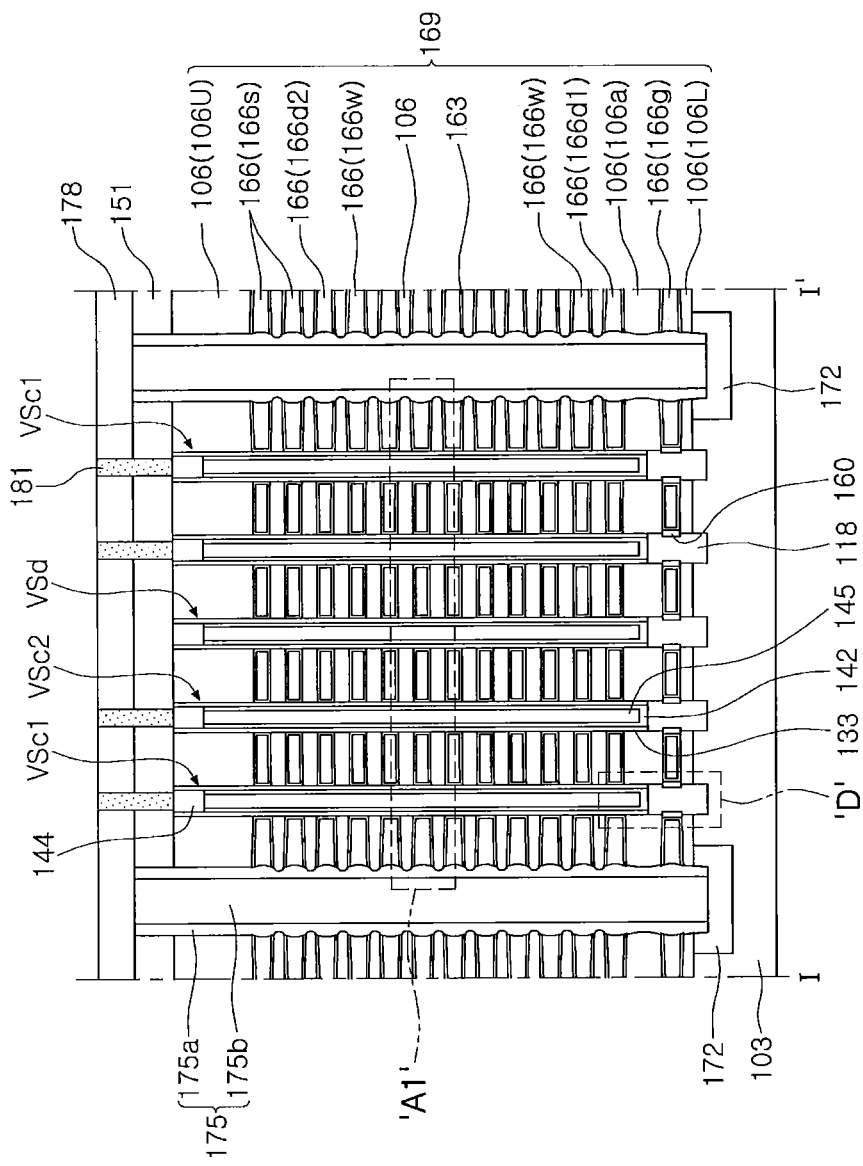
FIGS. 4A and 4B are cross-sectional views of a semiconductor device, according to an example embodiment of the invention.
Figure 4B:
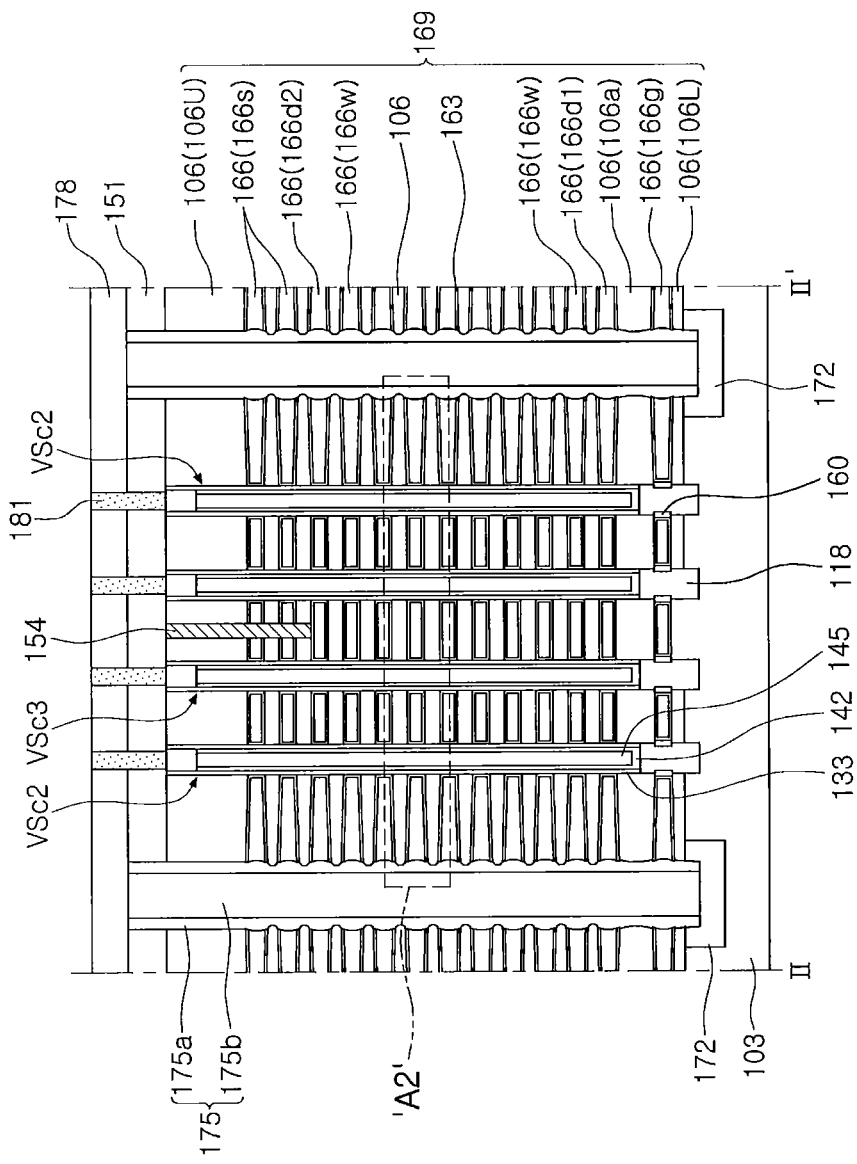
Figure 5A:
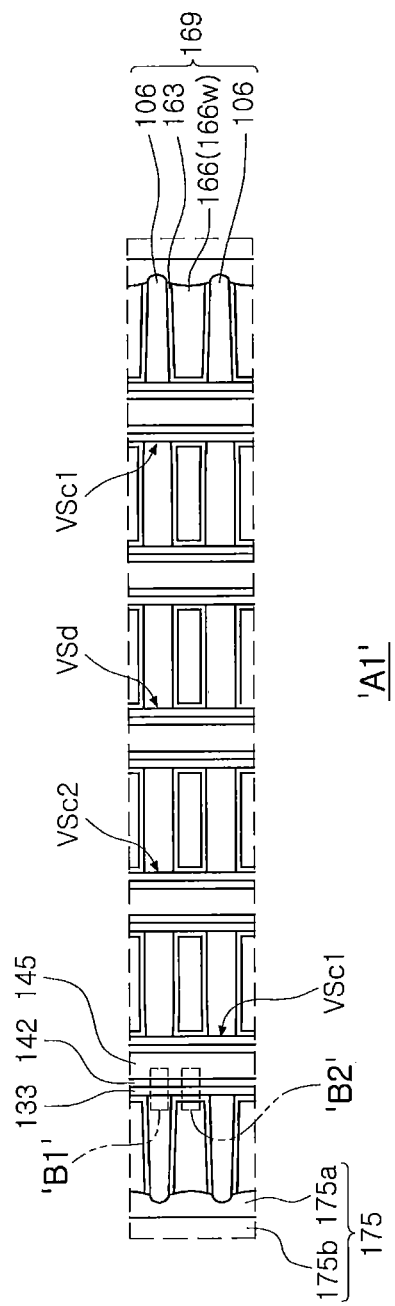
FIGS. 5A, 5B, 6A, 6B, and 8 are partially enlarged views illustrating a semiconductor device, according to an example embodiment of the invention.
Figure 5B:
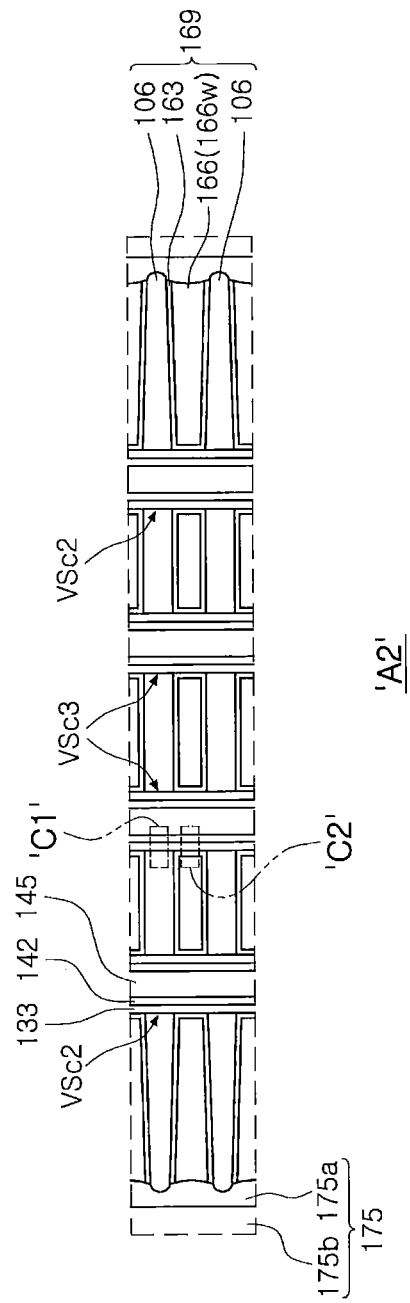

An example of the memory cell array region 20 (see, e.g., FIG. 1) of a semiconductor device 10, according to an example embodiment, will now be described with reference to FIGS. 3, 4A, and 4B. FIG. 3 is a plan view illustrating an example of the memory cell array region 20 (FIG. 1) of the semiconductor device 10, according to an embodiment of the invention; FIG. 4A is a cross-sectional view taken along line I-I' of FIG. 3; and FIG. 4B is a cross-sectional view taken along line II-II' of FIG. 3. In addition, FIG. 5A is a partially enlarged view of region "A1" of FIG. 4A and FIG. 5B is a partially enlarged view of region "A2" of FIG. 4B.

Referring to FIGS. 3, 4A, 4B, 5A, and 5B, a stack structure 169 may be disposed on a substrate 103, which may be a semiconductor substrate in some embodiments of the invention. For example, the substrate 103 may be a semiconductor substrate including a semiconductor region or a silicon region. The stack structure 169 may include interlayer insulating layers 106 and gate electrodes 166 alternately and repeatedly stacked. The gate electrodes 166 may be formed of a conductive material including at least one of doped polysilicon, a metal nitride (for example, TiN), a metal silicide (for example, WSi, TiSi, or TaSi), or a metal (for example, W). The interlayer insulating layers 106 may be formed of a silicon oxide. The gate electrodes 166 may include a lower gate electrode 166g, an upper gate electrode 166s disposed on the lower gate electrode 166g, and intermediate gate electrodes disposed between the upper gate electrode 166s and the lower gate electrode 166g, as shown. In one example, the lower gate electrode 166g may be the first select line SL1 described above with reference to FIG. 2. In another example, the upper gate electrode 166s may be the second select line SL2 described above with reference to FIG. 2. In a further example, the intermediate gate electrodes may include a first dummy line 166d1, a second dummy line 166d2, and word lines 166w disposed between the first and second dummy lines 166d1 and 166d2. The first dummy line 166d1 may be the first dummy line DL1 described above with reference to FIG. 2, the second dummy line 166d2 may be the second dummy line DL2 described above with reference to FIG. 2, and the word lines 166w may be the word lines WLs described above with reference to FIG. 2.

With respect to the interlayer insulating layers 106, a lowermost interlayer insulating layer 106L may be disposed between the lower gate electrode 166g and the substrate 103, a second lowermost interlayer insulating layer 106a may be disposed between the lower gate electrode 166g and the first dummy line 166d1, and an uppermost interlayer insulating layer 106U may be disposed on the upper gate electrode 166s.

A first capping insulating layer 151 and a second capping insulating layer 178 may be sequentially disposed on the stack structure 169. The first capping insulating layer 151 and the second capping insulating layer 178 may be formed of silicon oxides.

Separation structures 175 may be disposed on the substrate 103. Each of the separation structures 175 may include a conductive pattern 175b, and lateral spacers 175a disposed on lateral surfaces of the conductive pattern 175b. The conductive pattern 175b may include polycrystalline silicon, a metal nitride, a metal, or a metal silicide. The lateral spacers 175a may be formed of an insulating material, such as a silicon oxide. The separation structures 175 may pass through the stack structure 169 and the first capping insulating layer 151.

Source regions 172 may be disposed below the separation structures 175. In an example, the source regions 172 may be the common source line CSL described above with reference to FIG. 1 or 2. The source regions 172 may have n-type conductivity, and portions of the substrate 103 adjacent to the source regions 172 may have p-type conductivity.

An insulating line pattern 154 may extend in a length direction of the separation structures 175, may be disposed between the separation structures 175, and may pass through the upper gate electrode 166s, while traversing the upper gate electrode 166s. The insulating line pattern 154 may be formed of a silicon oxide. Vertical structures may be disposed on the substrate 103 to extend in a direction perpendicular to a surface of the substrate 103. The vertical structures may be disposed between the separation structures 175.

The vertical structures may include memory cell vertical structures VSc1, VSc2, and VSc3, and dummy vertical structures VSd. And, the memory cell vertical structures VSc1, VSc2, and VSc3 may include external memory cell vertical structures VSc1 relatively close to the separation structures 175, internal memory cell vertical structures VSc3 relatively distant from the separation structures 175, and intermediate memory cell vertical structures VSc2 disposed between the external memory cell vertical structures VSc1 and the internal memory cell vertical structures VSc2. Accordingly, the external memory cell vertical structures VSc1 may be closer to the separation structures 175 than to the internal memory cell vertical structures VSc3.

The dummy vertical structures VSd may pass through the stack structure 169, while passing through the insulating line pattern 154. The insulating line pattern 154 and the dummy vertical structures VSd may be disposed in a central portion between the separation structures 175. The dummy vertical structures VSd may be more distant from the separation structures 175 than from the memory cell vertical structures VSc1, VSc2, and VSc3. Each of the vertical structures VSd, VSc1, VSc2, and VSc3 may include a channel semiconductor layer 142 and a first gate dielectric 133.

According to one example, each of the vertical structures VSd, VSc1, VSc2, and VSc3 may include an insulating core pattern 145, and a pad layer 144 disposed on the insulating core pattern 145. The channel semiconductor layer 142 may surround a lateral surface of the insulating core pattern 145, and may cover a bottom surface of the insulating core pattern 145. The first gate dielectric 133 may surround an external surface of the channel semiconductor layer 142.

According to another example, each of the vertical structures VSd, VSc1, VSc2, and VSc3 may include a lower region 118 disposed below the channel semiconductor layer 142 and the first gate dielectric 133. The lower region 118 may connect to the channel semiconductor layer 142. In some embodiments, the lower region 118 may face the lower gate electrode 166g, and the channel semiconductor layer 142 may face the upper and intermediate gate electrodes 166s, 166d1, 166w, and 166d2.

The channel semiconductor layer 142 may be formed of a semiconductor material. For example, the channel semiconductor layer 142 may be formed of a semiconductor material, such as polycrystalline silicon. The lower region 118 may be formed of epitaxial silicon grown from the substrate 103 by an epitaxial process. The lower region 118 may be used as a channel region of a transistor including the lower gate electrode 166g. Such a transistor may be the first select transistor ST1 described above with reference to FIG. 2.

In example embodiments, the lower region 118 may also be referred to as a "semiconductor region," a "channel region," or a "silicon region." The pad layer 144 may be formed of doped polycrystalline silicon. For example, the pad layer 144 may be formed of polycrystalline silicon having n-type conductivity. The insulating core pattern 145 may be formed of an insulating material, such as a silicon oxide.

The first gate dielectric 133 may be disposed between the channel semiconductor layer 142 and the stack structure 169, so that the first gate dielectric 133 faces the stack structure 169. In addition, a second gate dielectric 163 may be interposed between the interlayer insulating layers 106 and the gate electrodes 166, and may extend between the gate electrodes 166 and the vertical structures VSd, VSc1, VSc2, and VSc3.

In some embodiments, a lower gate dielectric 160 may be disposed between the lower region 118 and the lower gate electrode 166g. The lower gate dielectric 160 may be formed as a silicon oxide layer, which is formed by thermal oxidation of the lower region 118. The lower gate dielectric 160 may contact the lower region 118, while contacting the second gate dielectric 163 interposed between the lower gate dielectric 160 and the lower gate electrode 166g.

Bit line contact plugs 181 may pass through the first and second capping insulating layers 151 and 178, and may electrically connect to the pad layers 144 of the memory cell vertical structures VSc1, VSc2, and VSc3. The bit line contact plugs 181 may electrically connect to the bit line BL described above with reference to FIGS. 1 and 2.

The pad layer 144 of the dummy vertical structure VSd may be spaced apart from the bit line contact plugs 181. Thus, the dummy vertical structure VSd may be electrically insulated from the bit line BL described above with reference to FIG. 1 or 2.

In an example, a distance between a portion of the interlayer insulating layers 106 disposed in a region close to the separation structures 175 may be greater than that between the remainder of the interlayer insulating layers 106 disposed in a region close to the dummy vertical structure VSd or to the internal memory cell vertical structure VSc3. Of the interlayer insulating layers 106 of the stack structure 169, a distance between the interlayer insulating layers 106 adjacent to each other in a vertical direction may be greater in a region close to the separation structures 175 than in a region distant therefrom. Since the distance between the interlayer insulating layers 106 may be dependent on the thickness of the gate electrodes 166, the thickness of a portion of the gate electrodes 166 disposed in a region close to the separation structures 175 may be greater than that of the remainder of the gate electrodes 166 disposed in a region close to the dummy vertical structure VSd or to the internal memory cell vertical structure VSc3.

At least one of the first and second gate dielectrics 133 and 163 may include a layer for storing information. For example, the first gate dielectric 133 may include a layer for storing information. However, example embodiments of the present inventive concept are not limited thereto. For example, the second gate dielectric 163 may also include a layer for storing information.

Figure 6A:
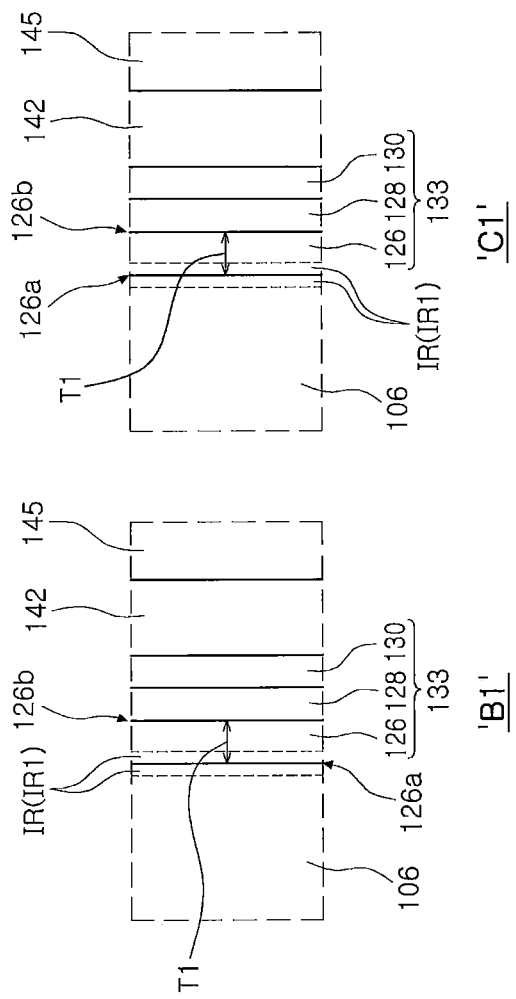
Figure 6B:
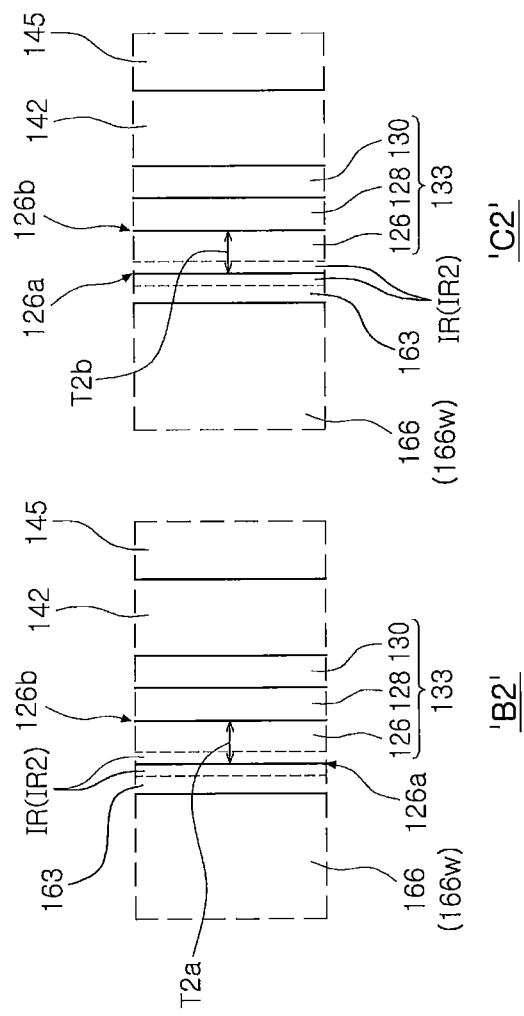

An example of a semiconductor device, including the first gate dielectric 133 having a layer for storing information, will be described hereinafter, with reference to FIGS. 6A and 6B, together with the contents described above with reference to FIGS. 3, 4A, 4B, 5A, and 5B. FIG. 6A is partially enlarged views of region "B1" of FIG. 5A and region "C1" of FIG. 5B, and FIG. 6B is partially enlarged views of region "B2" of FIG. 5A and region "C2" of FIG. 5B.

Referring to FIGS. 3 through 5B, 6A, and 6B, the first gate dielectric 133 may include a blocking dielectric 126, an data storage layer 128, and a tunnel dielectric 130. The data storage layer 128 may be disposed between the tunnel dielectric 130 and the blocking dielectric 126. The tunnel dielectric 130 may contact the channel semiconductor layer 142. The stack structure 169 may include the interlayer insulating layers 106 and the gate electrodes 166 facing the blocking dielectric 126 of the first gate dielectric 133. As described above, the second gate dielectric 163 may include a portion disposed between the blocking dielectric 126 and the gate electrodes 166.

The tunnel dielectric 130 may include a silicon oxide and/or an impurity-doped silicon oxide. The data storage layer 128 may be interposed between the channel semiconductor layer 142 and the gate electrodes 166, and may be a layer for storing information in a non-volatile memory device, such as a flash memory device. For example, the data storage layer 128 may be formed of a material, for example, a silicon nitride, that may trap and retain electrons injected from the channel semiconductor layer 142 through the tunnel dielectric 130, or that may remove electrons trapped within the data storage layer 128, according to operating conditions of a non-volatile memory device, such as a flash memory device. The second gate dielectric 163 may include a high-k material, for example, AlO or the like.

The data storage layer 128 may store data in regions facing a portion, for example, the word lines 166w, of the gate electrodes 166 that may correspond to the word lines WLs described above with reference to FIG. 1 or 2. The regions of the data storage layer 128 of at least one of the memory cell vertical structures VSc1, VSc2, and VSc3, in which information may be stored, may be arranged in a direction perpendicular to the surface of the substrate 103, and may constitute the memory string S described above with reference to FIG. 2.

The blocking dielectric 126 may be formed of a silicon oxide. The blocking dielectric 126 may have a first surface 126a facing the stack structure 169 including the interlayer insulating layers 106, the second gate dielectric 163, and the gate electrodes 166, and a second surface 126b facing the data storage layer 128. The first surface 126a of the blocking dielectric 126 may contact the interlayer insulating layers 106 and the second gate dielectric 163.

The first surface 126a of the blocking dielectric 126, facing the stack structure 169 including the interlayer insulating layers 106, the second gate dielectric 163, and the gate electrodes 166, may also be referred to as a "boundary 126a" between the blocking dielectric 126 and the stack structure 169.

In an example embodiment, a lateral impurity region IR may be disposed within a region adjacent to the first surface 126a of the blocking dielectric 126, for example, the boundary 126a. For example, the lateral impurity region IR may include a first impurity region IR1 (FIG. 6A), which is disposed within a boundary region between the blocking dielectric 126 and the interlayer insulating layers 106, and a second impurity region IR2 (FIG. 6B), which is disposed within a boundary region between the second gate dielectric 163 and the blocking dielectric 126. Thus, the lateral impurity region IR may be disposed within the boundary region between the blocking dielectric 126 and the interlayer insulating layers 106, and may also extend into the boundary region between the second gate dielectric 163 and the blocking dielectric 126. In some embodiments, the lateral impurity region IR may include carbon as an impurity, and may even include carbon and nitrogen as impurities.

In an example, the first impurity region IR1 (FIG. 6A) of the lateral impurity region IR may include a region in which an impurity may diffuse from the boundary 126a between the blocking dielectric 126 and the interlayer insulating layers 106 into the blocking dielectric 126, and a region in which an impurity may diffuse from the boundary 126a between the blocking dielectric 126 and the interlayer insulating layers 106 into the interlayer insulating layers 106. When the blocking dielectric 126 and the interlayer insulating layers 106 are formed of silicon oxides, the first impurity region IR1 (FIG. 6A) of the lateral impurity region IR may be formed of a silicon oxide including an impurity. The impurity may include carbon, or may include carbon and nitrogen.

In another example, the second impurity region IR2 (FIG. 6B) of the lateral impurity region IR may include a region in which an impurity may diffuse from the boundary 126a between the blocking dielectric 126 and the second gate dielectric 163 into the blocking dielectric 126, and a region in which an impurity may diffuse from the boundary 126a between the blocking dielectric 126 and the second gate dielectric 163 into the second gate dielectric 163. When the blocking dielectric 126 is a silicon oxide and the second gate dielectric 163 is an aluminum oxide, the second impurity region IR2 (FIG. 6B) of the lateral impurity region IR may be formed of a silicon oxide including an impurity and an aluminum oxide including an impurity. The impurity may include carbon, or may include carbon and nitrogen.

An example of the concentration distribution of the lateral impurity region IR will be described with reference to FIG. 7, which is a graph illustrating the example of the concentration distribution of the lateral impurity region IR disposed within a boundary region between the interlayer insulating layer 106 and the blocking dielectric 126.

Figure 7:
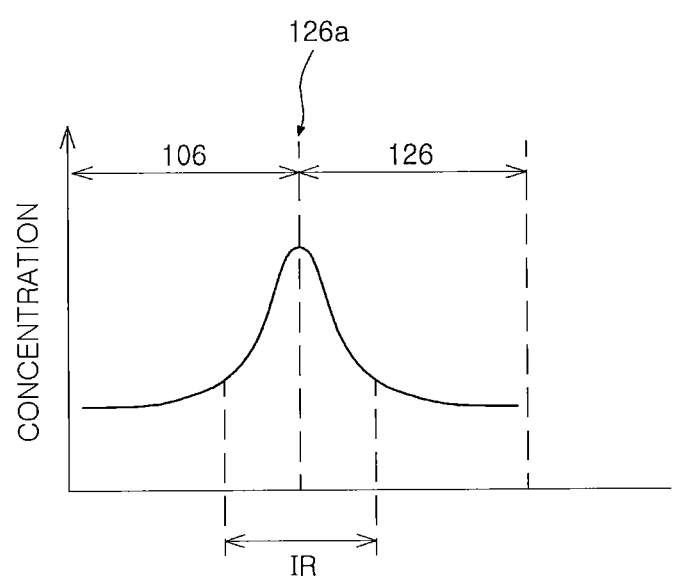
FIG. 7 is a graph illustrating an impurity profile in a portion of a semiconductor device, according to an example embodiment of the invention.

Referring to FIG. 7, the lateral impurity region IR may be formed within the boundary region between the interlayer insulating layer 106 and the blocking dielectric 126. The first impurity region IR1 may have the highest impurity concentration in the boundary 126a between the interlayer insulating layer 106 and the blocking dielectric 126.

Referring again to FIGS. 3, 4A, and 4B, the first gate dielectric 133 may extend between the channel semiconductor layer 142 and the stack structure 169, however other configurations may also be possible. For example, the channel semiconductor layer 142 may include a bent portion in a lower region thereof.

Figure 8:
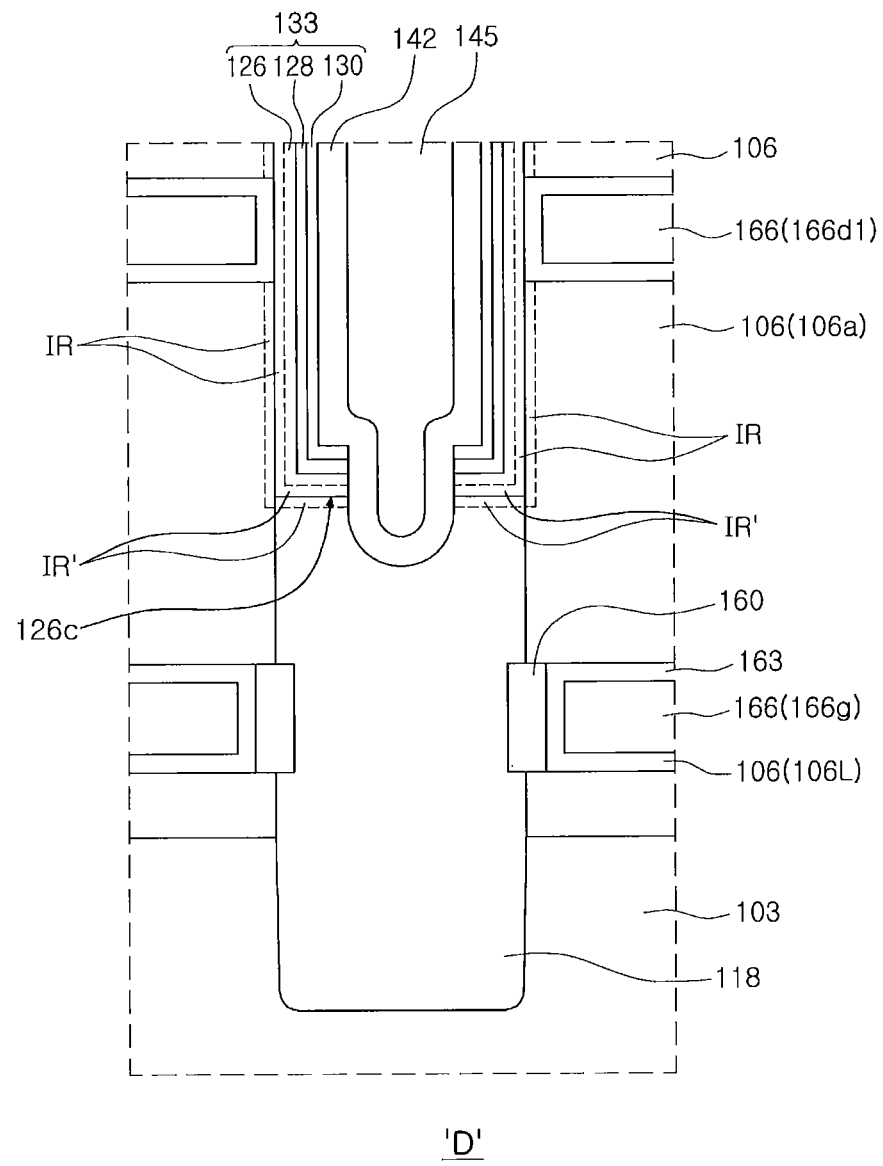

An example of a semiconductor device, which includes the channel semiconductor layer 142 that is modified as described above, will be described with reference to FIG. 8, which is a partially enlarged view illustrating a modified example of region "D" of FIG. 4A. Referring to FIG. 8, the first gate dielectric 133 may include a portion bent from a lower portion facing the stack structure 169, and facing the lower region 118. As described above, the lower region 118 may be referred to as the "semiconductor region," or the "silicon region." The blocking dielectric 126 may contact the lower region 118 while the stack structure 169, the data storage layer 128 may be disposed between the channel semiconductor layer 142 and the blocking dielectric 126, and may be spaced apart from the lower region 118, and the tunnel dielectric 130 may be disposed between the data storage layer 128 and the channel semiconductor layer 142, and may be spaced apart from the lower region 118.

A lower impurity region IR' may extend from the lateral impurity region IR formed within the boundary region between the interlayer insulating layer 106 and the blocking dielectric 126 into the boundary region between the blocking dielectric 126 and the lower region 118. The lateral impurity region IR' may include the same impurity as the lateral impurity region IR. According to one example, the lateral and lower impurity regions IR and IR' may include carbon as impurities, or carbon and/or nitrogen as impurities.

In another example, the channel semiconductor layer 142 may extend from an upper surface of the lower region 118 into the lower region 118. A lower portion of the channel semiconductor layer 142 may be disposed on a level lower than that of a lower portion of the first gate dielectric 133. The channel semiconductor layer 142 may also extend from the upper surface of the lower region 118 into the lower region 118 to contact a portion of the lower region 118 not including the lower impurity region IR'. In this manner, the lower impurity region IR' may inhibit contact resistance between the channel semiconductor layer 142 and the lower region 118 from increasing, so that a level of resistance between the channel semiconductor layer 142 and the lower region 118 may be significantly reduced.

Referring again to FIGS. 3, 4A, and 4B, each of the above-mentioned vertical structures VSd, VSc1, VSc2, and VSc3 may include the channel semiconductor layer 142 not facing a portion of the gate electrodes 166 of the stack structure 169, for example, the lower gate electrode 166g, and facing the remaining gate electrodes 166d1, 166w, 166d2, and 166s. However, example embodiments of the present inventive concept are not limited thereto. The above-mentioned vertical structures VSd, VSc1, VSc2, and VSc3 may be modified to include a channel semiconductor layer facing the entirety of the gate electrodes 166 of the stack structure 169. An example of the vertical structures VSd, VSc1, VSc2, and VSc3 that may be modified as described above, will be described with reference to FIG. 9A, which is a cross-sectional view conceptually illustrating a modified example of a semiconductor device, according to an example embodiment.

Figure 9A:
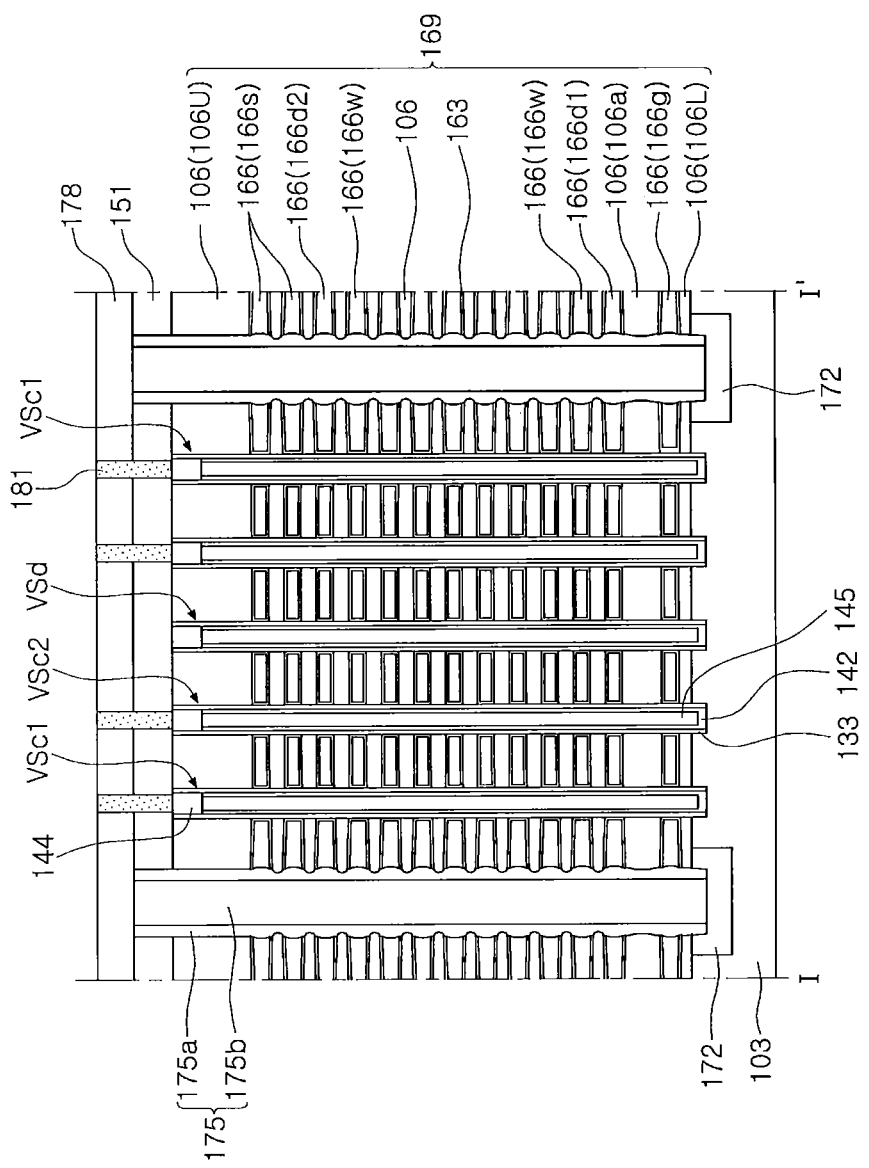
FIG. 9A is a cross-sectional view of a modified semiconductor device, according to an example embodiment of the invention.

Referring to FIG. 9A, the channel semiconductor layer 142 of each of the vertical structures VSd, VSc1, VSc2, and VSc3 may pass through the stack structure 169. Thus, the channel semiconductor layer 142 may face the upper gate electrode 166s, the intermediate gate electrodes 166d1, 166w, and 166d2, and the lower gate electrode 166g of the gate electrodes 166. The first gate dielectric 133 may be interposed between the channel semiconductor layer 142 and the gate electrodes 166.

The vertical structures VSd, VSc1, VSc2, and VSc3 may include a blocking dielectric the same as that described above with reference to FIGS. 3 through 7, and the vertical structures VSd, VSc1, VSc2, and VSc3 and the stack structure 169 may include a lateral impurity region the same as that described above with reference to FIGS. 3 through 7 therebetween. In addition, a lower impurity region, which may be substantially the same as that described above with reference to FIG. 8, may be disposed within the boundary region between the blocking dielectric of each of the vertical structure VSd, VSc1, VSc2, and VSc3 and the substrate 103.

The lateral impurity region and the lower impurity region as described above have been described above with reference to FIGS. 3 through 7, and detailed descriptions thereof will thus be omitted.

The above-mentioned vertical structures VSd, VSc1, VSc2, and VSc3 may be spaced apart from each other, however, other configurations are also possible. For example, a modified example of the vertical structures VSd, VSc1, VSc2, and VSc3 will be described with reference to FIG. 9B, which is a cross-sectional view conceptually illustrating another modified example of a semiconductor device, according to an example embodiment of the invention.

Figure 9B:
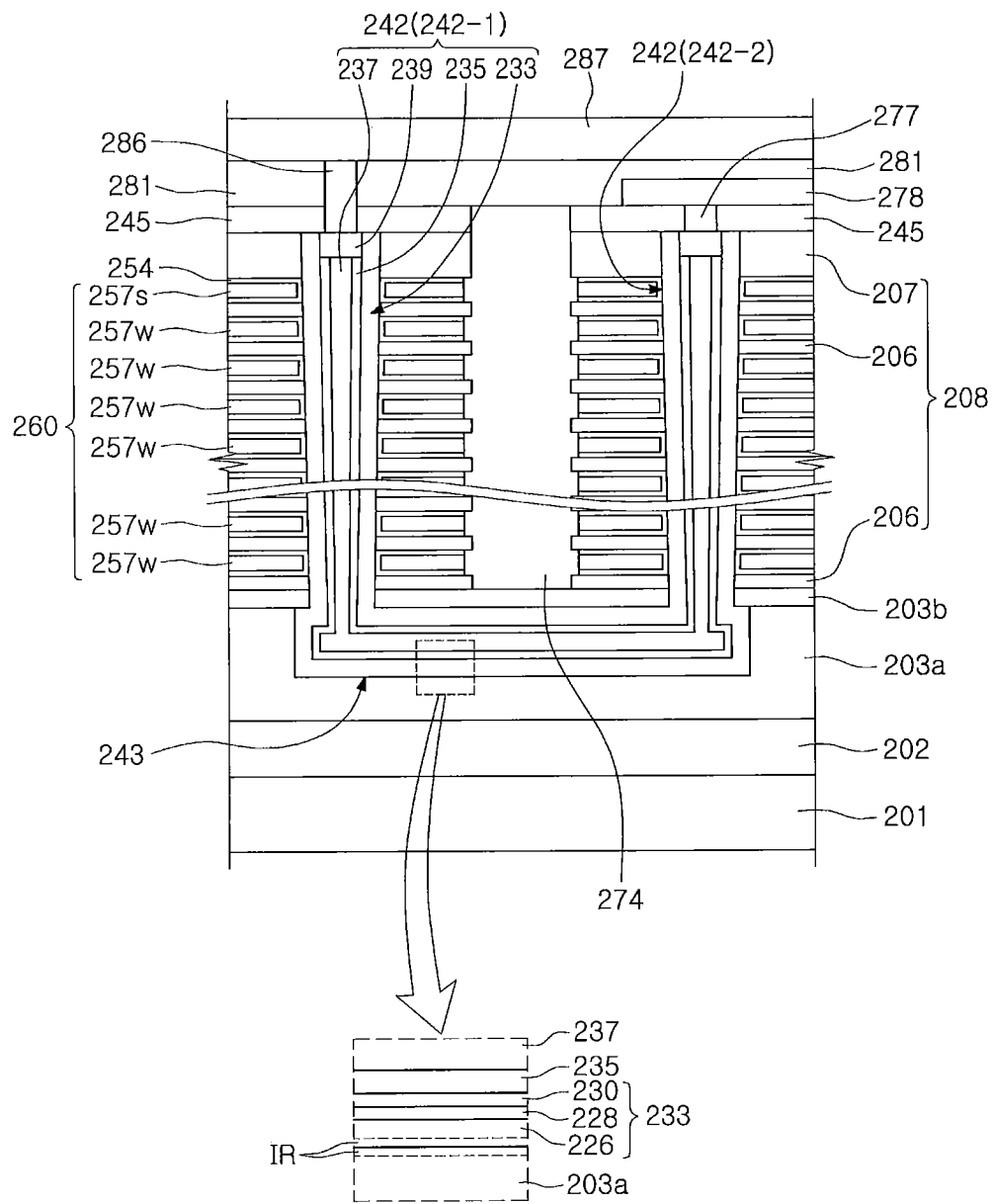
FIG. 9B is a cross-sectional view of a modified semiconductor device, according to an example embodiment of the invention.

Referring to FIG. 9B, an insulating layer 202 may be disposed on a substrate 201. A first lower region 203a and a second lower region 203b may be sequentially disposed on the insulating layer 202. The first and second lower regions 203a and 203b may be formed of a semiconductor material or a doped silicon material, and may be referred to as a "semiconductor region" or a "silicon region." The first and second lower regions 203a and 203b may be a back gate electrode or a pipe gate electrode.

Stack structure 208 and 260 may be disposed on the second lower region 203b. The stack structure 208 and 260 may include interlayer insulating layers 206 and 207 collectively represented by an interlayer insulating layer 208, and gate electrodes 257s and 257w, collectively represented by a gate electrode 260, and the interlayer insulating layers 206 and 207 and the gate electrodes 257s and 257w may be stacked sequentially. The interlayer insulating layer 208 may include lower interlayer insulating layers 206, and an upper interlayer insulating layer 207 disposed above the lower interlayer insulating layers 206. The upper interlayer insulating layer 207 may be thicker than each of the lower interlayer insulating layers 206. The gate electrodes 257s and 257w may be interposed between the interlayer insulating layers 206 and 207. An uppermost gate electrode 257s of the gate electrode 260 may be a select gate electrode. The gate electrodes 257w disposed below the uppermost gate electrode 257s, of the gate electrode 260, may be word lines.

A first capping insulating layer 245 and a second capping insulating layer 281 may be sequentially disposed on the stack structure 208 and 260. A separation structure 274 may pass through the first capping insulating layer 245 and the stack structure 208 and 260. The separation structure 274 may be formed of an insulating material, such as a silicon oxide.

Memory cell vertical structures 242 may pass through the stack structure 208 and 260. The memory cell vertical structures 242 may include a first vertical structure 242_1 and a second vertical structure 242_2 facing each other, with the separation structure 274 therebetween.

The first and second vertical structures 242_1 and 242_2 of the memory cell vertical structures 242 may be connected to each other by a connection portion 243 that may extend from lower portions of the first and second vertical structures 242_1 and 242_2 in a horizontal direction. The connection portion 243 may be embedded in the first and second lower regions 203a and 203b, and may connect the lower portions of the first and second vertical structures 242_1 and 242_2.

Each of the first and second vertical structures 242_1 and 242_2 may include an insulating core pattern 237, a channel semiconductor layer 235, a first gate dielectric 233, and a pad layer 239. The insulating core pattern 237, the channel semiconductor layer 235, the first gate dielectric 233, and the pad layer 239 may correspond to the insulating core pattern 145, the channel semiconductor layer 142, the first gate dielectric 133, and the pad layer 144 described above with reference to FIGS. 3, 4A, and 4B, respectively.

The first gate dielectric 233 may include a blocking dielectric 226, an data storage layer 228, and a tunnel dielectric 230, and the blocking dielectric 226, the data storage layer 228, and the tunnel dielectric 230 may correspond to the blocking dielectric 126, the data storage layer 128, and the tunnel dielectric 130 described above with reference to FIGS. 3 through 7, respectively.

In the first and second vertical structures 242_1 and 242_2 and the connection portion 243, portions of the insulating core pattern 237 may connect to each other below the stack structure 208 and 260 and the separation structure 274, while passing through the stack structure 208 and 260, and the channel semiconductor layer 235 may be interposed between the insulating core pattern 237 and the first gate dielectric 233. The pad layer 239 may be disposed within an upper region of each of the first and second vertical structures 242_1 and 242_2, and may connect to the channel semiconductor layer 235. The pad layer 239 may be formed of polycrystalline silicon having n-type conductivity.

According to some embodiments, an impurity region IR" may be disposed within a boundary region between the blocking dielectric 226 of each of the first and second vertical structures 242_1 and 242_2 and the stack structure 208 and 260, and a boundary region between the blocking dielectric 226 and the first and second lower regions 203a and 203b. The impurity region IR" may include substantially the same impurity as that included in the lateral and lower impurity regions IR and IR' described above. For example, the impurity region IR" may include carbon as an impurity, or may include carbon or nitrogen as an impurity.

A bit line 287 may be disposed on the second capping insulating layer 281. A bit line contact plug 286 may be disposed between the bit line 287 and the first vertical structure 242_1. A source line 278 may be disposed on the first capping insulating layer 245. A source contact plug 277 may be disposed between the source line 278 and the second vertical structure 242_2.

An example of a method of forming a semiconductor device, according to an example embodiment, will be described with reference to FIGS. 10 through 15, where: (i) FIGS. 10, 11, and 13 through 15 are cross-sectional views taken along line I-I' of FIG. 3, (ii) FIG. 12A is a flowchart illustrating an example of a method of forming a semiconductor device, and (iii) FIG. 12B is a flowchart illustrating a modified example of a method of forming a semiconductor device, according to an example embodiment.

Figure 10:
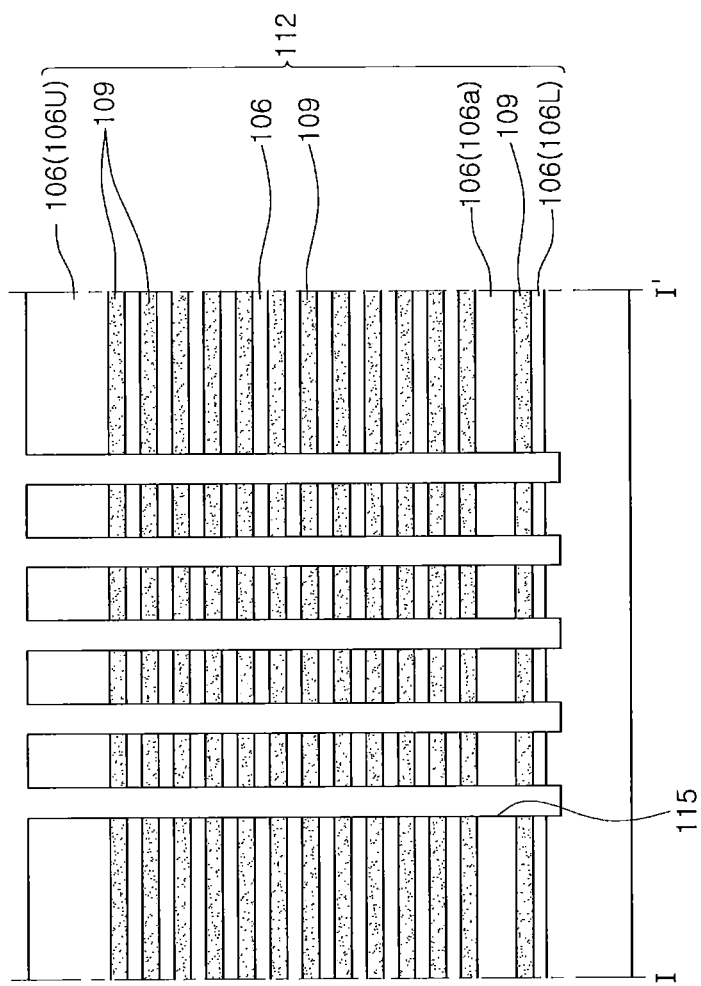
FIGS. 10, 11, 13, 14, and 15 are cross-sectional views illustrating a method of forming a semiconductor device, according to an example embodiment of the invention.

Referring to FIG. 10, a substrate 103, such as a semiconductor substrate, may be provided, and a molded structure 112 may be formed on the substrate 103. The molded structure 112 may include interlayer insulating layers 106 and sacrificial gate layers 109 alternately stacked on each other. In the molded structure 112, an uppermost interlayer insulating layer 106U and a lowermost interlayer insulating layer 106L may be interlayer insulating layers. In the interlayer insulating layers 106, a second lowermost interlayer insulating layer 106a may be thicker than the lowermost interlayer insulating layer 106L.

The interlayer insulating layers 106 may be sequentially arranged in a direction perpendicular to the substrate 103, and may be spaced apart from each other. Each of the sacrificial gate layers 109 may be interposed between the interlayer insulating layers 106. The interlayer insulating layers 106 may be formed of a silicon oxide, for example, and the sacrificial gate layers 109 may be formed of a silicon nitride, for example. A hole 115 may be formed to pass through the molded structure 112, extend into the substrate 103, and expose the substrate 103. The hole 115 may be formed as a plurality of holes.

Figure 11:
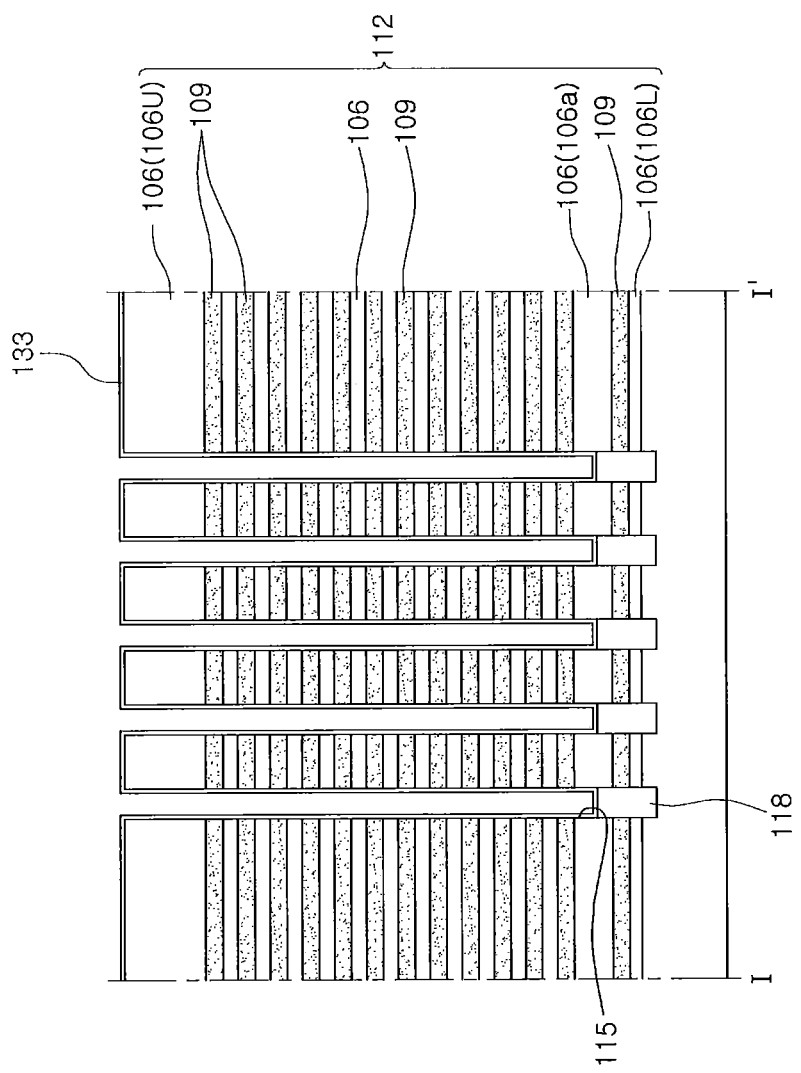
Figure 12A:
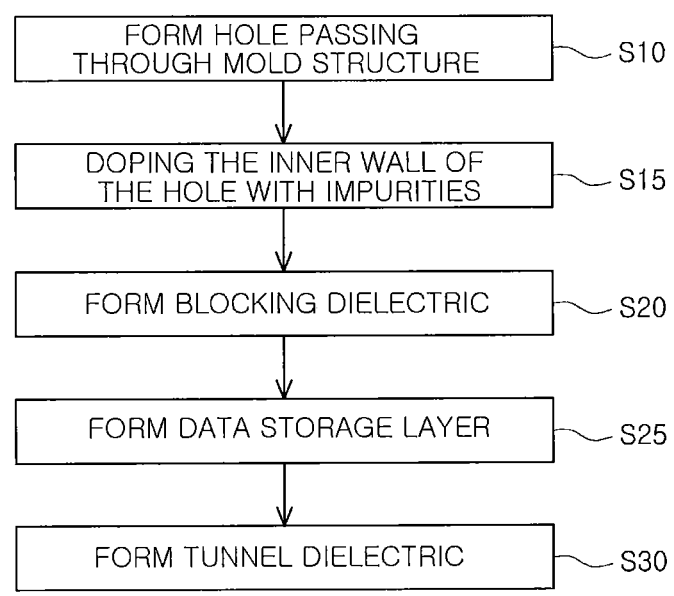
FIG. 12A is a flowchart of steps that illustrates a method of forming a semiconductor device, according to an example embodiment of the invention.
Figure 12B:
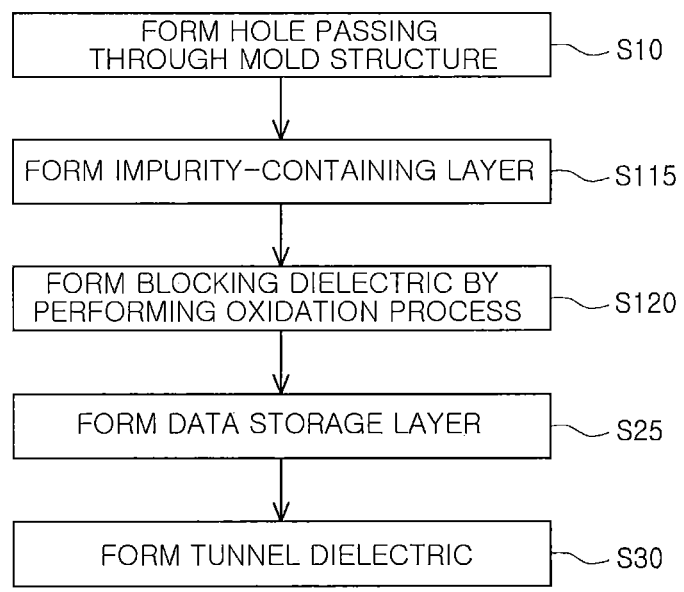
FIG. 12B is a flowchart of steps that illustrates a method of forming a semiconductor device, according to an example embodiment of the invention.

Referring to FIG. 11, a lower region 118 may be formed to fill a lower region of the hole 115. The lower region 118 may be an epitaxial silicon layer formed using a selective epitaxial growth (SEG) process. A conformal, first gate dielectric 133 may be formed on the substrate 103 having the lower region 118.

An example of a method of forming the first gate dielectric 133 will be described with reference to FIGS. 10, 11, 12A, and 12B.

Referring to FIGS. 10, 11, and 12A, the hole 115, passing through the molded structure 112, may be formed (S10), and an inner wall of the hole 115 may be doped with an impurity (S15). Doping the inner wall of the hole 115 with the impurity may be performed after forming the lower region 118 within the lower region of the hole 115. To form the semiconductor device described above with reference to FIG. 9, doping the inner wall of the hole 115 with the impurity (e.g., carbon) may also be performed after omitting forming the lower region 118. Subsequently, a blocking dielectric may be formed (S20). The blocking dielectric may be the blocking dielectric 126 (FIG. 6A or 6B) described above with reference to FIGS. 3 through 6B.

Forming the blocking dielectric may include forming a conformal preparatory layer on the substrate 103 having the hole 115, and forming the blocking dielectric of an oxide obtained by oxidizing the preparatory layer, which may be formed of a material different from that of the interlayer insulating layers 106 or the sacrificial gate layers 109 of the molded structure 112. In some embodiments, the interlayer insulating layers 106 may be formed of a silicon oxide, the sacrificial gate layers 109 may be formed of a silicon nitride, and the preparatory layer may be formed as a silicon layer. Oxidizing the preparatory layer may include oxidizing the entirety of the preparatory layer without substantially oxidizing the molded structure 112.

While the preparatory layer is oxidized, the impurity injected into the inner wall of the hole 115 may diffuse, so that an impurity region may be formed within a boundary region between the molded structure 112 and the blocking dielectric 126 (FIG. 6A or 6B) from the inner wall of the hole 115. For example, the first impurity region IR1 (FIG. 6A) of the lateral impurity region IR formed within the boundary region between the interlayer insulating layers 106 and the blocking dielectric 126, described above with reference to FIGS. 3 through 6B, and the lower impurity region IR' (FIG. 8) formed within the boundary region between the blocking dielectric 126 and the lower region 118, described above with reference to FIG. 8, may be formed of the impurity diffused while the preparatory layer is oxidized. Subsequently, an data storage layer may be formed (S25). The data storage layer may be the data storage layer 128 (FIG. 6A or 6B) described above with reference to FIGS. 3 through 6B. Subsequently, a tunnel dielectric may be formed (S30). The tunnel dielectric may be the tunnel dielectric 130 (FIG. 6A or 6B) described above with reference to FIGS. 3 through 6B.

Referring to the modified example and FIGS. 10, 11, and 12B, the hole 115, passing through the molded structure 112, as described above, may be formed (S10). Subsequently, an impurity-containing layer may be formed (S115). The impurity-containing layer may conformally cover the inner wall of the hole 115. In some embodiments, the impurity-containing layer may be a silicon layer containing carbon, such as a carbon-doped silicon layer. In other embodiments, the impurity-containing layer may be a layer containing carbon, nitrogen, and silicon, such as SiCN or SiOCN layer.

Subsequently, a blocking dielectric may be formed by an oxidation process (S120). The oxidation process may oxidize the impurity-containing layer to form a silicon oxide, and simultaneously, may diffuse an impurity contained in the impurity-containing layer into a boundary region between the impurity-containing layer and the molded structure 112 and a boundary region between the impurity-containing layer and the lower region 118. Thus, the impurity-containing layer may be formed as a silicon oxide layer, and the impurity contained in the impurity-containing layer may diffuse into the boundary region between the impurity-containing layer and the molded structure 112 and the boundary region between the impurity-containing layer and the lower region 118, to form an impurity region. Subsequently, an data storage layer may be formed (S25) and then a tunnel dielectric may be formed (S30). Thus, as the processes described above with reference to FIG. 12A or 12B are performed, an impurity may remain, or may be formed, on an external surface of the first gate dielectric 133.

Figure 13:
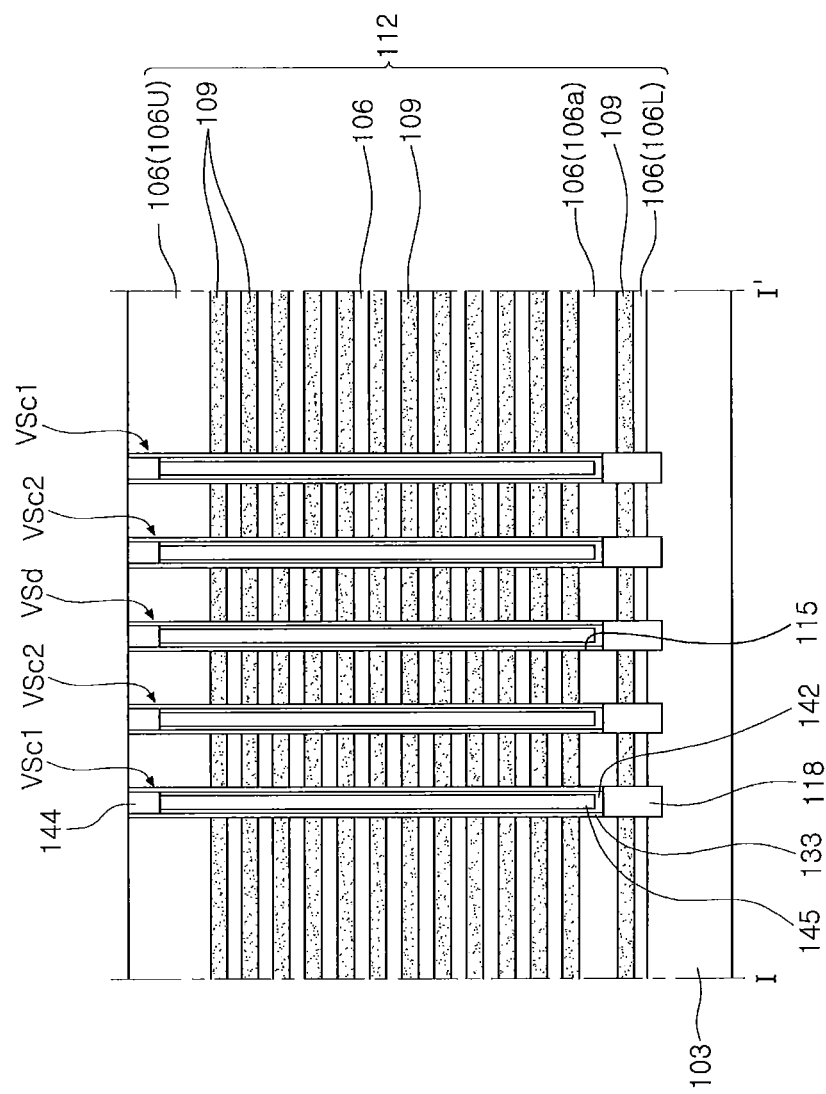

Subsequently, referring to FIG. 13, a channel semiconductor layer 142 may be conformally formed on the substrate 103 having the first gate dielectric 133, an insulating core pattern 145 may be formed on the channel semiconductor layer 142 to fill a portion of the hole 115, and a pad layer 144 may be formed on the insulating core pattern 145 to fill the remainder of the hole 115. While the insulating core pattern 145 is formed, a portion of the channel semiconductor layer 142 disposed above the insulating core pattern 145 may be removed, and while the pad layer 144 is formed, a portion of the first gate dielectric 133 disposed above the uppermost interlayer insulating layer 106U may be removed. Thus, vertical structures may be formed within the holes 115. The vertical structures may include the memory cell vertical structures VSc1, VSc2, and VSc3 and the dummy vertical structure VSd, as described above with reference to FIGS. 3 through 6B.

Figure 14:
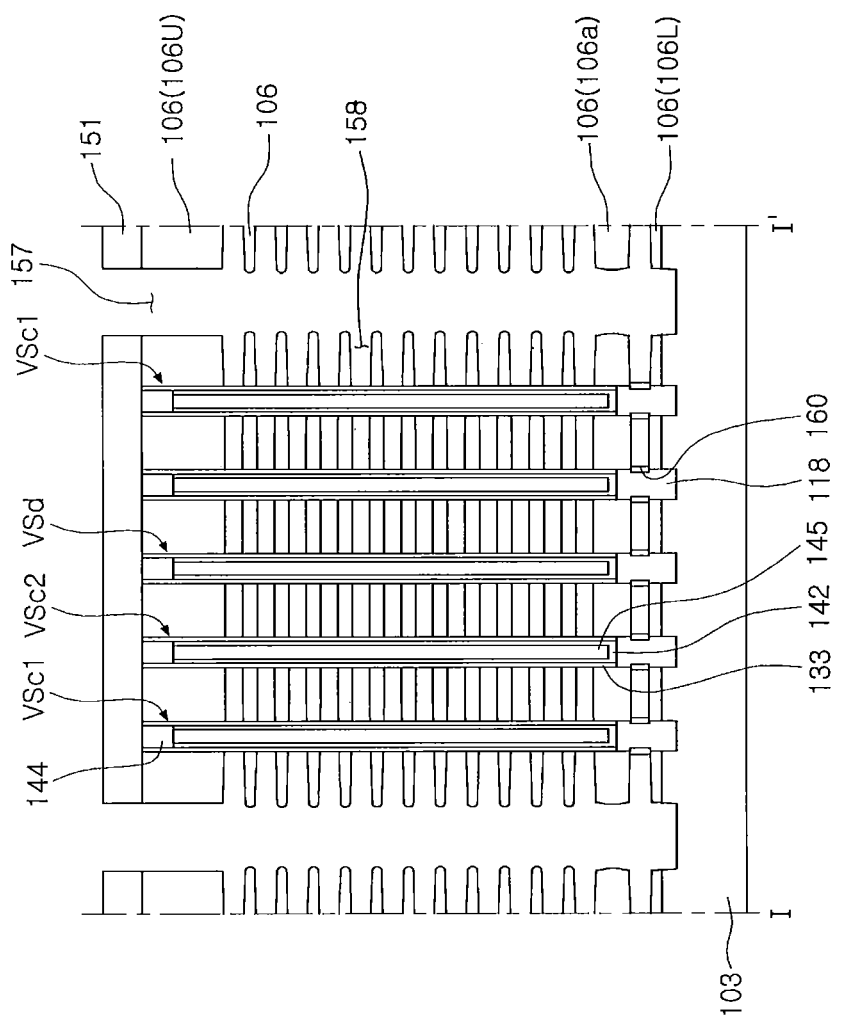

Referring to FIG. 14, trenches 157 may be formed to pass through the first capping insulating layer 151 and the molded structure 112 (FIG. 13) and to expose the substrate 103. Subsequently, voids 158 may be formed by removing the sacrificial gate layers 109 (FIG. 13) of the molded structure 112 (FIG. 13) exposed by the trenches 157.

In an example, forming the voids 158 by removing the sacrificial gate layers 109 (FIG. 13) may include removing a portion of the sacrificial gate layers 109 (FIG. 13), etching a portion of the interlayer insulating layers 106 to extend entrances of the voids 158 close to the trenches 157, and removing the remainder of the sacrificial gate layers 109.

As described above with reference to FIGS. 12A and 12B, the first gate dielectric 133 may include the blocking dielectric. The blocking dielectric of the first gate dielectric 133, as described above, may include the lateral impurity region IR described above with reference to FIG. 6A or 6B. The lateral impurity region IR (FIG. 6A or 6B), as described above, may prevent or significantly reduce etching damage to the blocking dielectric of the first gate dielectric 133, while the sacrificial gate layers 109 (FIG. 13) are etched to form the voids 158. Thus, the lateral impurity region IR (FIG. 6A or 6B), as described above, may serve to improve the thickness distribution properties of the blocking dielectric of the first gate dielectric 133. Thereafter, lower gate dielectrics 160 may be formed on lateral surfaces of the lower region 118 exposed by the voids 158. The lower gate dielectrics 160 may be formed using a thermal oxidation process.

Figure 15:
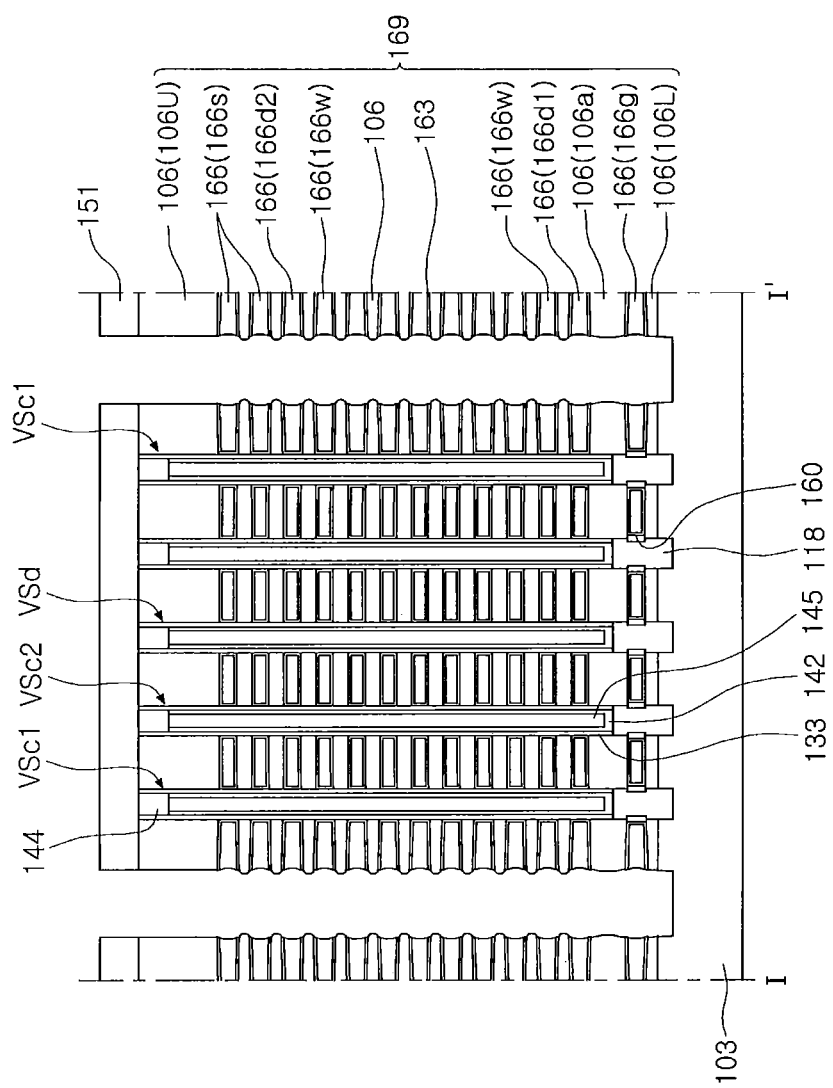

Referring now to FIG. 15, second gate dielectrics 163 may be formed to conformally cover inner walls of the voids 158, and gate electrodes 166 may be formed to fill the voids 158. A portion of the impurity, remaining on the external surface of the first gate dielectric 133, as described above with reference to FIG. 12A or 12B, may diffuse into the second gate dielectric 163 to form a portion of the lateral impurity region IR.

Referring again to FIGS. 3A, 4A, and 4B, separation structures 175 may be formed to fill the trenches 157 (FIG. 15). Forming the separation structures 175 may include forming lateral spacers 175a on sidewalls of the trenches 157, and forming conductive patterns 175b filling the trenches 157. In an example, prior to forming the conductive patterns 175b, source regions 172 may be formed within portions of the substrate 103 exposed by the trenches 157. Thus, the source regions 172 may be formed below the separation structures 175.

A second capping insulating layer 178 may be formed to cover the separation structures 175 and the first capping insulating layer 151. Next, bit line contact plugs 181 may be formed to pass through the first and second capping insulating layers 151 and 178, and to electrically connect to the pad layers 144 of the memory cell vertical structures VSc1, VSc2, and VSc3.

The semiconductor device, according to an example embodiment, may include: the blocking dielectric 126 disposed in the lower region 118; the stack structure 169 including the interlayer insulating layer 106 and the gate electrode 166 facing the blocking dielectric 126; the lateral impurity region IR disposed within the boundary region between the interlayer insulating layer 106 and the blocking dielectric 126; and the lower impurity region IR' disposed within the boundary region between the lower region 118 and the blocking dielectric 126.

The semiconductor device, according to an example embodiment, may include: the memory cell vertical structures VSc1, VSc2, and VSc3 disposed on the substrate 103; the stack structure 169 disposed on the substrate 103, and including the interlayer insulating layer 106 and the gate electrode 166 facing the memory cell vertical structures VSc1, VSc2, and VSc3; and the lateral impurity region IR disposed within the boundary region between the memory cell vertical structures VSc1, VSc2, and VSc3 and the stack structure 169.

The semiconductor device, according to an example embodiment, may include: the lower region 118 (FIG. 4A, 4B, or FIG. 8), or the first lower region 203a and the second lower region 203b (FIG. 9B); the blocking dielectric 126 (FIG. 8) disposed on the lower region 118 (FIG. 4A, 4B, or FIG. 8), or the blocking dielectric 226 (FIG. 9B) disposed on the first lower region 203a and the second lower region 203b (FIG. 9B); the stack structure 169 (FIG. 4A, 4B, or FIG. 8) including the interlayer insulating layer 106 (FIG. 4A, 4B, or FIG. 8) and the gate electrode 166 (FIG. 4A, 4B, or FIG. 8) facing the blocking dielectric 126 (FIG. 4A, 4B, or FIG. 8), or the stack structure 208 and 260 (FIG. 9B) including the interlayer insulating layer 208 (FIG. 9B) and the gate electrode 260 (FIG. 9B) facing the blocking dielectric 226 (FIG. 9B); and the lateral impurity region IR' (FIG. 8) disposed within the boundary region between the lower region 118 (FIG. 4A, 4B, or FIG. 8) and the blocking dielectric 126 (FIG. 4A, 4B, or FIG. 8), or the lower impurity region IR" (FIG. 9B) disposed within the boundary region between the first lower region 203a and the second lower region 203b (FIG. 9B) and the blocking dielectric 226 (FIG. 9B).

According to example embodiments, the lateral impurity region IR (FIG. 6A or 6B), as described above, may serve to improve the thickness distribution properties of the blocking dielectric 126 of the first gate dielectric 133. For example, in the lateral impurity region IR formed within the boundary region between the stack structure 169 and the blocking dielectric 126, a portion of the lateral impurity region IR formed on the external surface of the blocking dielectric 126 may significantly inhibit a reduction in the thickness of the blocking dielectric 126 that may otherwise occur the etching process for removing the sacrificial gate layers 109 (FIG. 13) described above with reference to FIG. 14, in order to form the gate electrode 166 of the stack structure 169. Thus, the lateral impurity region IR may improve the thickness distribution properties of the blocking dielectric 126. The improved thickness distribution properties of the blocking dielectric 126 may increase the performance of the semiconductor device, or may increase the number of the gate electrodes 166 disposed within the stack structure 169, thus enhancing a degree of integration of the semiconductor device.

As set forth above, according to example embodiments of the present inventive concept, there may be provided a semiconductor device that may improve the thickness distribution properties of a blocking dielectric, facing a stack structure including a gate electrode and an interlayer insulating layer. For example, an impurity region may be formed within a boundary region between the stack structure and the blocking dielectric, so that a reduction in the thickness of the blocking dielectric that may occur during a process of forming the gate electrode within the stack structure may be significantly reduced. Thus, the thickness distribution properties of the blocking dielectric may be improved. The improved thickness distribution properties of the blocking dielectric may increase the performance of the semiconductor device, or may increase the number of gate electrodes disposed within the stack structure, thus enhancing a degree of integration of the semiconductor device.

While exemplary embodiments have been shown and described above, it will be apparent to those skilled in the art that modifications and variations could be made without departing from the scope of the present inventive concept, as defined by the appended claims.

What is claimed is:

1. An integrated circuit memory device, comprising:
a stack structure comprising an interlayer insulating layer and a gate electrode, on a substrate;
a blocking dielectric region on a sidewall of an opening in said stack structure;
a lateral impurity region extending between said blocking dielectric region and the interlayer insulating layer and between said blocking dielectric region and the gate electrode; and
a lower impurity region extending between said blocking dielectric region and the substrate.

2. The device of claim 1, further comprising a lower region on the substrate, said lower region comprising a semiconductor material in contact with said blocking dielectric region.

3. The device of claim 2, wherein at least a portion of said lower impurity region extends within said lower region; and wherein said lower region is electrically coupled to the substrate.

4. The device of claim 2, further comprising:

a data storage layer on the blocking dielectric region;

a tunnel dielectric layer on the data storage layer; and a channel semiconductor layer extending on said tunnel dielectric layer and contacting the lower region.

5. The device of claim 4, wherein said blocking dielectric region, said data storage layer and said tunnel dielectric layer extend between said channel semiconductor layer and the gate electrode.

6. The device of claim 5, further comprising a gate dielectric layer extending between the gate electrode and the blocking dielectric region; and wherein a dielectric constant associated with said gate dielectric layer is greater than a dielectric constant associated with said blocking dielectric region.

7. The device of claim 6, wherein said gate dielectric layer contacts said blocking dielectric region; and wherein said lateral impurity region extends into a boundary between said gate dielectric layer and said blocking dielectric region.

8. The device of claim 1, wherein said lateral impurity region comprises a carbon impurity.

9. A non-volatile memory cell, comprising:

a semiconductor channel region;

a data storage region on said semiconductor channel region;

a tunnel dielectric region extending between said semiconductor channel region and said data storage region;

a gate dielectric region on said data storage region, said gate dielectric region comprising a carbon impurity region therein;

a blocking dielectric region extending between said gate dielectric region and said data storage region, said blocking dielectric region comprising a carbon impurity region therein; and a gate electrode on said gate dielectric region.

10. The memory cell of claim 9, wherein a dielectric constant associated with said gate dielectric region is greater than a dielectric constant associated with said blocking dielectric region.

11. The memory cell of claim 10, wherein said gate dielectric region contacts said blocking dielectric region at an interface therebetween; wherein a level of carbon impurities in said gate dielectric region varies as a function of distance from the interface; and wherein a level of carbon impurities in said blocking dielectric region varies as a function of distance from the interface.

\* \* \* \* \*